United States Patent [19]

Chattin

[11] Patent Number: 4,868,462
[45] Date of Patent: Sep. 19, 1989

[54] HIGH VOLTAGE TRANSFORMER FOR HIGH FREQUENCY MEDICAL X-RAY GENERATOR

[75] Inventor: Robert A. Chattin, Mundelein, Ill.

[73] Assignee: Gendex Corporation, Franklin Park, Ill.

[21] Appl. No.: 148,843

[22] Filed: Jan. 27, 1988

[51] Int. Cl.$^4$ .............. H05G 1/02; H05G 1/10; H05K 1/14; H02M 5/40
[52] U.S. Cl. .................... 315/277; 378/101; 361/412; 361/414; 361/415; 363/8; 363/34; 363/144
[58] Field of Search ............ 315/276, 277, 141, 205, 315/239, 245, 363; 378/101, 104, 105, 107, 210; 363/8, 34, 37, 68, 126, 144, 146, 171, 172, 178; 361/377, 395, 412, 413, 414, 415

[56] References Cited

U.S. PATENT DOCUMENTS 4,737,903  4/1988  Nishikawa et al. ............... 363/144

Primary Examiner—David Mis
Attorney, Agent, or Firm—Roger J. French

[57] ABSTRACT

A high voltage transformer assembly for use in a high frequency medical X-ray generator comprises a plurality of transformers, a plurality of filter capacitors, and a pair of capacitor printed circuit boards for mounting the capacitors and for coupling the capacitors in electrical circuit to define a plurality of relatively high power handling capacitance circuits. A plurality of diodes are provided, and diode printed circuit boards mount the diodes and couple the diodes in electrical circuit to define a plurality of relatively high power handling diode circuit elements. A frame, and top and bottom plate-like members, and other joining structure join together the frame and the top and bottom plate-like members, and the capacitor printed circuit boards to form an enclosure wherein the top and bottom plate-like members and the capacitor printed circuit boards comprise four sides of a generally rectilinear, six-sided enclosure. The diode printed circuit boards are mounted to the opposite, open ends of this enclosure so as to generally span the remaining two sides of the rectilinear enclosure. The transformers, the diodes, and the capacitors are electrically connected in circuit to form a high voltage transformer circuit.

10 Claims, 5 Drawing Sheets

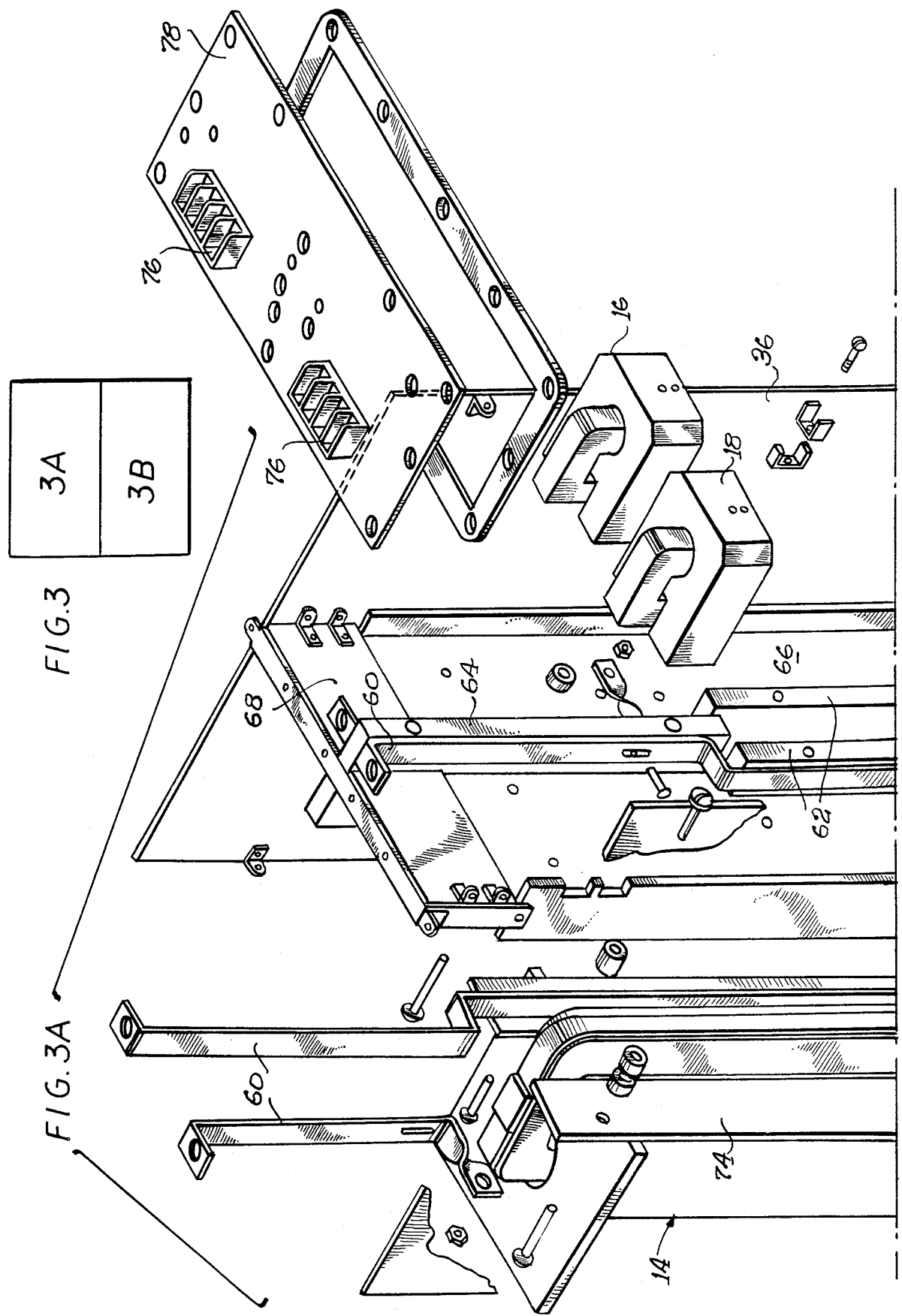

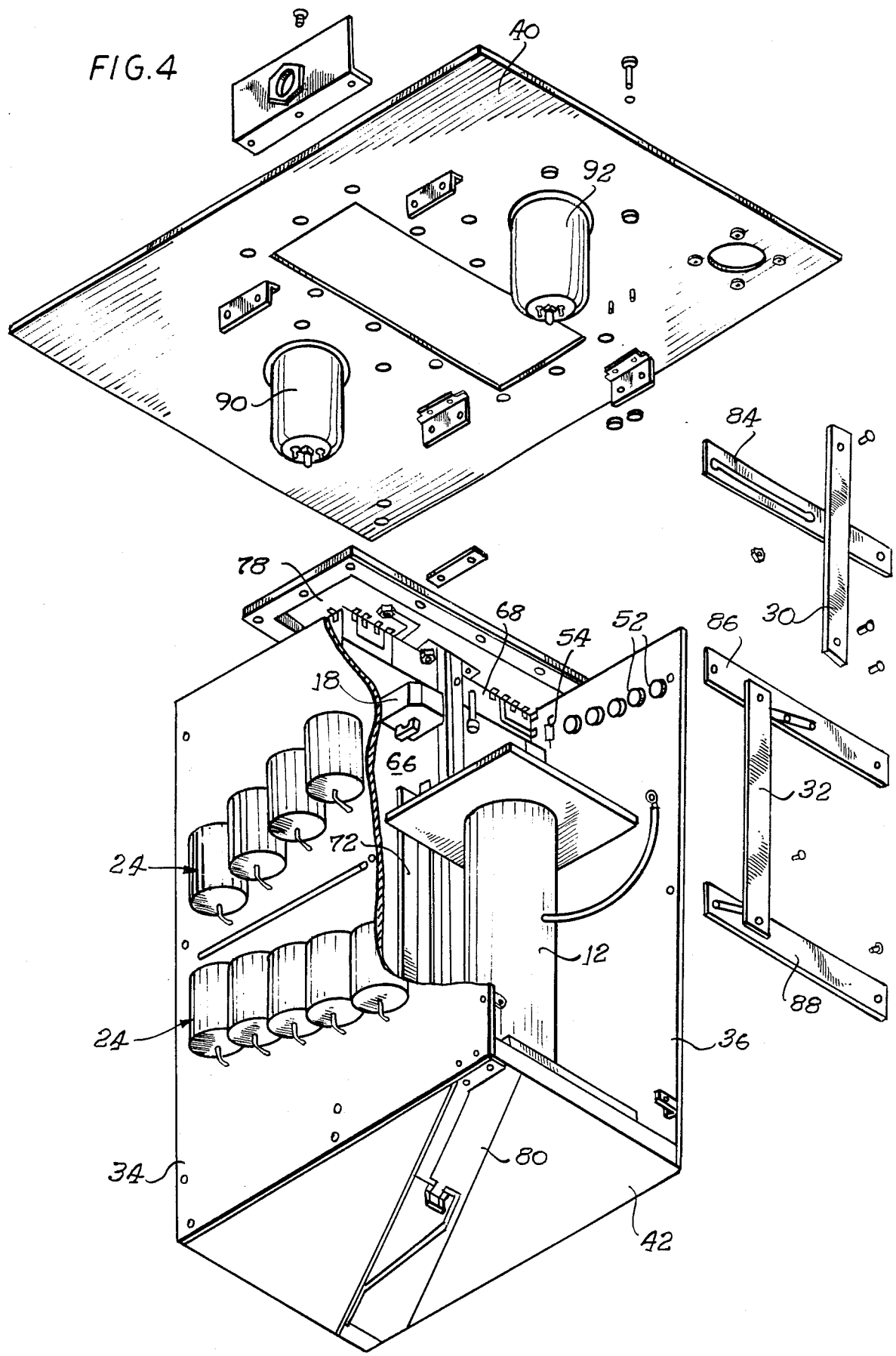

HIGH VOLTAGE TRANSFORMER FOR HIGH FREQUENCY MEDICAL X-RAY GENERATOR

BACKGROUND OF THE INVENTION

The present invention is in the field of high frequency medical X-ray generators. More particularly, the invention is directed to improvements in high frequency X-ray generators for radiographic or medical imaging applications, or so-called diagnostic X-ray equipment. More particularly yet, the present invention concerns a novel and improved high voltage transformer assembly for a high frequency medical X-ray generator.

Generally speaking, high voltage transformer circuits for medical X-ray generators utilize a plurality of relatively large circuit components which have relatively high power-handling capacities. For example, relatively large high voltage transformers are utilized for both anode and cathode portions of the transformer circuit, and relatively large filter capacitors are also required for use with these high voltage transformers. In fact, the power handling requirements are such that the capacitance elements in both the anode and cathode circuits are generally not supplied with the transformer. Therefore, the output voltage of such a transformer is in the form of an unfiltered rectified AC. However, in our novel arrangement, the necessary capacitance elements are included, being formed by coupling in circuit a plurality of relatively large capacitor elements of relatively high power handling capabilities.

Similarly, the respective rectifier portions of the anode and cathode transformer circuit portions are generally formed in our novel arrangement by coupling in circuit a large number of smaller individual rectifier or diode elements, again to achieve the necessary power handling capacity of the circuit.

Additionally, positive and negative kilovoltage (KV) outputs from the high voltage transformer circuit are taken at a relatively high impedance output, which is established by bridging the positive and negative ends of the high voltage transformer circuit with high impedance resistance elements. Preferably, the required high impedance and high power handling capabilities of these resistance elements are achieved in our novel arrangement by using a plurality of relatively smaller resistor elements coupled in circuit to form the necessary high impedance circuit element.

Finally, a filament transformer for the X-ray tube filaments may also be provided, in accordance with our present invention, as part of the high voltage transformer assembly.

Our invention advantageously provides a relatively orderly and easy to assemble "packaging" arrangement for the high voltage transformer circuit. Our method of assembling and packaging the foregoing circuit elements advantageously provides a unitary or modular type component for relative ease of assembly in manufacturing. Moreover, our novel modular form of assembly permits relative uniformity in wiring, circuit connections and the like from one transformer circuit and assembly to the next. This permits a high degree of reliability in manufacture, as well as a relatively high degree of uniformity from one production unit to the next, and substantially minimizes variations in performance among assemblies produced in accordance with our invention.

This high degree of uniformity and repeatability of results utilizing assemblies made in accordance with our invention will be appreciated to promote uniform and repeatable results in the field when these assemblies are further assembled with medical X-ray units. Hence, with such a high degree of repeatability and uniformity, damaged units in the field can readily and simply be replaced by new or refurbished assemblies, with confidence that the performance of the replacement assembly will be virtually identical to that of the original high voltage transformer circuit upon initial installation.

Hence, our invention, by providing a relatively orderly and uniform assembly, promotes not only a savings in manufacturing cost, but also both increased reliability and savings in costs of providing field service.

We have also found in connection with our high voltage transformer assembly that encapsulate-type filament transformers may advantageously be used as the filament transformer for the X-ray tube. Moreover, such encapsulate transformers may readily be mounted to the high voltage transformer assembly, thus further simplifying the overall assembly of the medical X-ray equipment.

OBJECTS AND SUMMARY OF THE INVENTION

Accordingly, it is a general object of the invention to provide a novel and improved high voltage transformer assembly for a medical X-ray generator in accordance with the foregoing considerations.

Briefly, and in accordance with the foregoing discussion, a high voltage transformer assembly for use in a medical X-ray generator comprises a plurality of transformers; a plurality of filter capacitors; a pair of capacitor printed circuit boards for mounting said plurality of capacitors and for coupling said capacitors electrically together in a predetermined circuit configuration to form a plurality of relatively large high-power capacitance circuit elements; a plurality of diodes; diode printed circuit board means for mounting said diodes and for electrically coupling said diodes together in a predetermined circuit configuration to form a plurality of relatively high power capacity diode circuit elements; frame means; top and bottom plate-like members; and means for interconnecting said frame means said top and bottom plate-like members and said pair of capacitor printed circuit boards together to form an enclosure, with said top and bottom plate-like members and said capacitor printed circuit boards defining four sides of a generally rectilinear, six-sided enclosure; means for mounting respective ones of said diode printed circuit board means to opposite open ends of said enclosure so as to generally span the remaining two sides of the generally rectilinear enclosure; and means for electrically interconnecting said transformers, said diodes and said capacitors together in circuit to form a high voltage transformer circuit.

DETAILED DESCRIPTION OF THE DRAWINGS

The features of the present invention which are believed to be novel are set forth with particularity in the appended claims. The organization and manner of operation of the invention, together with further objects and advantages thereof, may best be understood by reference to the following description, taken in connection with the accompanying drawings, in which like reference numerals identify like elements, and in which:

Figure 1:
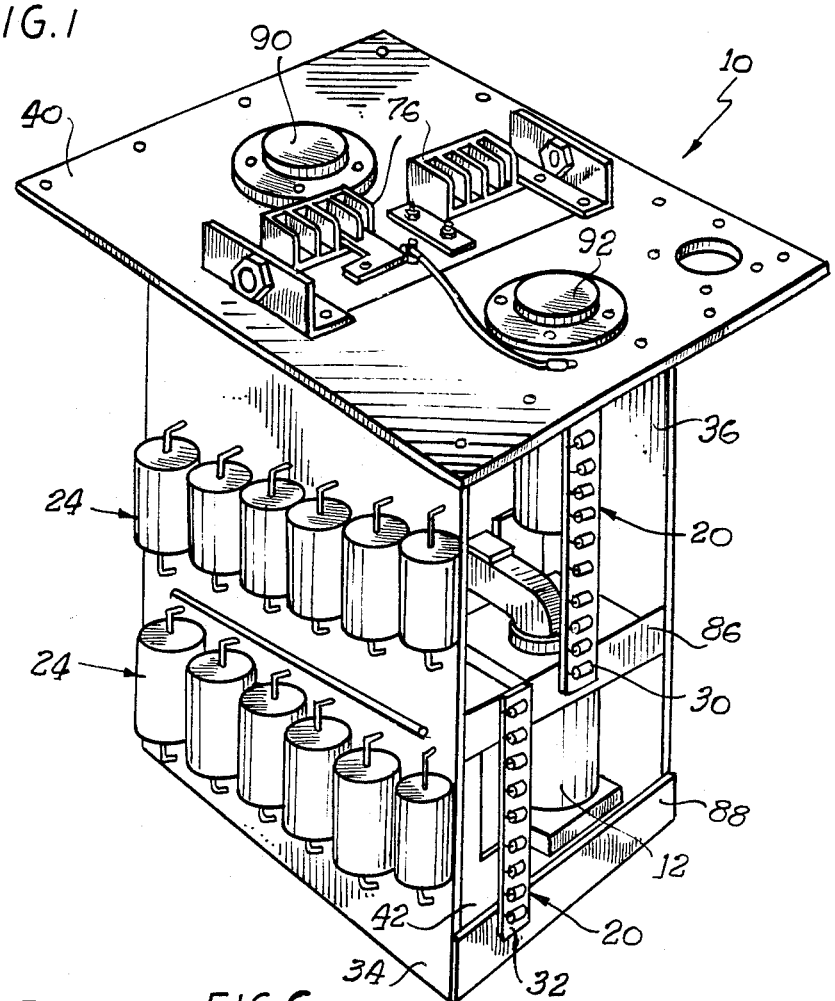
FIG. 1 is an assembled perspective view of a high voltage transformer assembly in accordance with the present invention.
Figure 5:
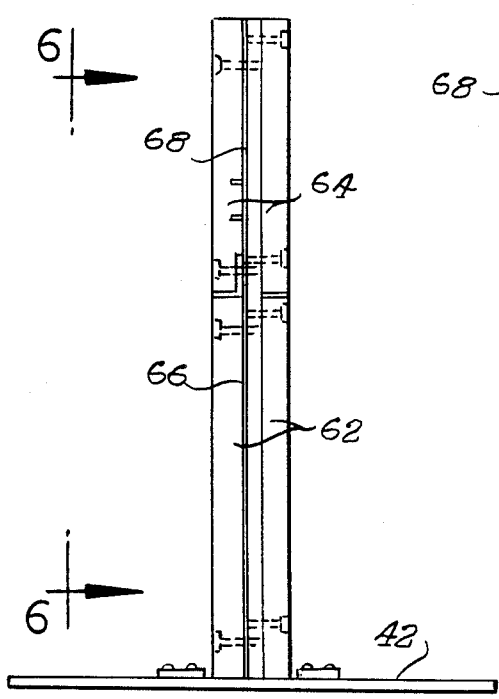
Figure 6:
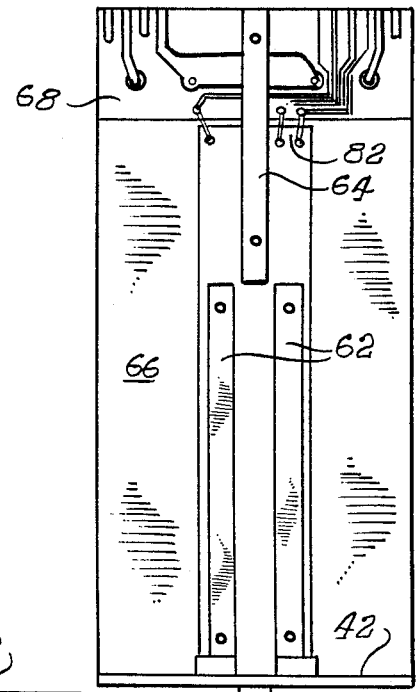
Figure 3B:
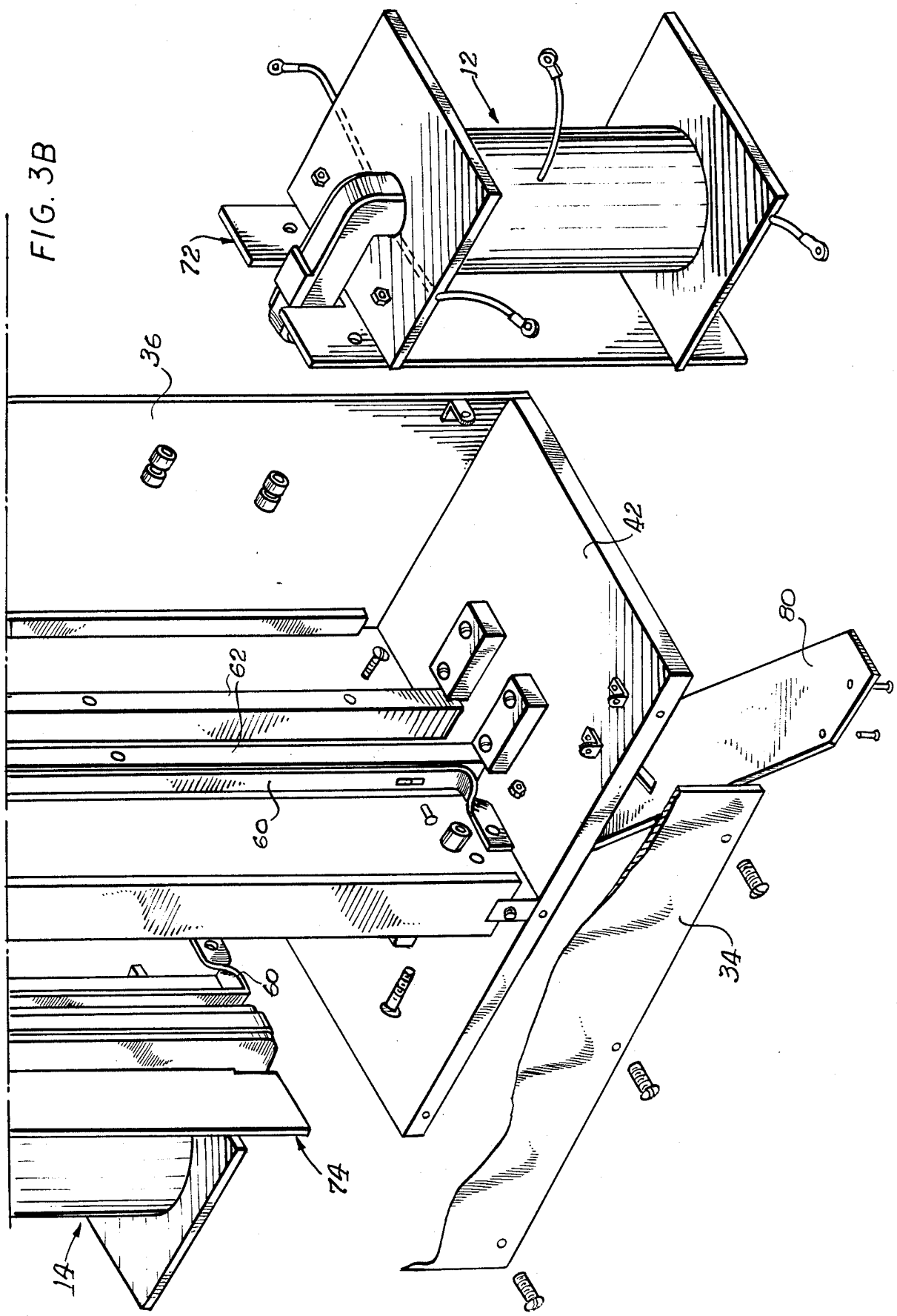

FIGS. 3A and 3B, taken together, form an exploded perspective view of the high voltage transformer assembly of FIG. 1, illustrating the assemby thereof;

FIG. 4 is an exploded perspective view of the assembly of FIG. 1, illustrating a further stage in the assembly thereof, following that shown in FIG. 3;

FIG. 5 is a side elevation showing a partially assembled portion of the assembly of FIG. 1;

FIG. 6 is a side elevation taken generally along the line 6—6 of FIG. 5; and

Figure 7:
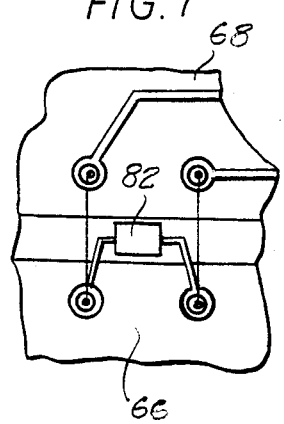

FIG. 7 is an enlarged view of a small portion of FIG. 6 illustrating some further details thereof.

DETAILED DESCRIPTION OF THE ILLUSTRATED EMBODIMENT

Referring now to the drawings initially to FIG. 1, the present invention provides a high voltage transformer assembly designated generally by the reference numeral 10. Advantageously the assembly 10 in accordance with the present invention provides a relatively orderly, generally rectilinear box-like package or enclosure, as best viewed in FIG. 1. This orderly package or module may thus advantageously be readily and easily assembled with other components of a high voltage X-ray apparatus. Moreover, as will be more fully explained hereinbelow, the individual parts and components of the transformer assembly 10 are so interconnected both mechanically and electrically, as to provide a high degree of repeatability, that is, similarity in performance characteristics, from one module to the next, when assembled in accordance with the invention.

Turning now in more detailed to the drawings, and referring also to FIGS. 3 and 4, the assembly 10 includes a plurality of transformers, which in the illustrated embodiment include high voltage transformers 12, 14 and filament transformers 16, 18, all best viewed in FIG. 3.

A plurality of diodes, are somewhat diagrammatically illustrated in FIG. 1 at reference numerals 20 and 22 (see FIG. 1). Similarly, a plurality of capacitor elements, indicated at reference numerals 24 and 26 also form part of the assembly 10. In accordance with the feature of the invention, the diodes 20, 22 and capacitors 24, 26 are mounted to respective diode printed circuit boards 30, 32 and capacitor printed circuit boards 34, 36. In order to form a modular-type enclosure for the high voltage transformer assembly 10, respective top and bottom plates or plate-like members 40, 42 are also provided.

In accordance with a feature of the invention, joining means are provided, in the form of respective frame members, brackets and fasteners, as illustrated in the drawings, for joining together the top and bottom plates or plate-like members 40 and the respective capacitor printed circuit boards 34 and 36 to form a generally rectiliear box-like enclosure. As best viewed in FIG. 1, the assembly 10, and particularly the top and bottom plates and capacitor printed circuit boards, generally make up four sides of a generally rectilinear, six-sided enclosure or box-like module defining the high voltage transformer assembly 10.

Moreover, additional mounting members, to be described presently, are provided for mounting the diode printed circuit boards 30, 32 to opposite, open ends of the enclosure thus defined so as to generally span the remaining two, otherwise open sides of this six-sided rectilinear enclosure. In this regard, it will be appreciated that the capacitor printed circuit board 36 mounts at its unseen side a plurality of capacitors similar to the capacitors 24 and 26 illustrated in the drawings. Similarly, the unseen otherwise open end of the enclosure formed as described above also mounts similar diode printed circuit boards in the same fashion as those shown in the drawings. Hence, while only one perspective view of the assembly 10 is illustrated, it will be appreciated that the opposite side of printed circuit board 36, as well as the opposite open end of the enclosure appear substantially similar to the respective illustrated outer side of circuit board 34 and respective diode circuit boards and their mounting arrangement as shown in FIG. 4. Moreover, the respective diode printed circuit boards and capacitor printed circuit boards, as well as further electrical connecting means to be described presently, interconnect the transformers, diodes and capacitors in circuit to generally form or define a high voltage transformer circuit of the type illustrated in FIG. 2.

Figure 2:
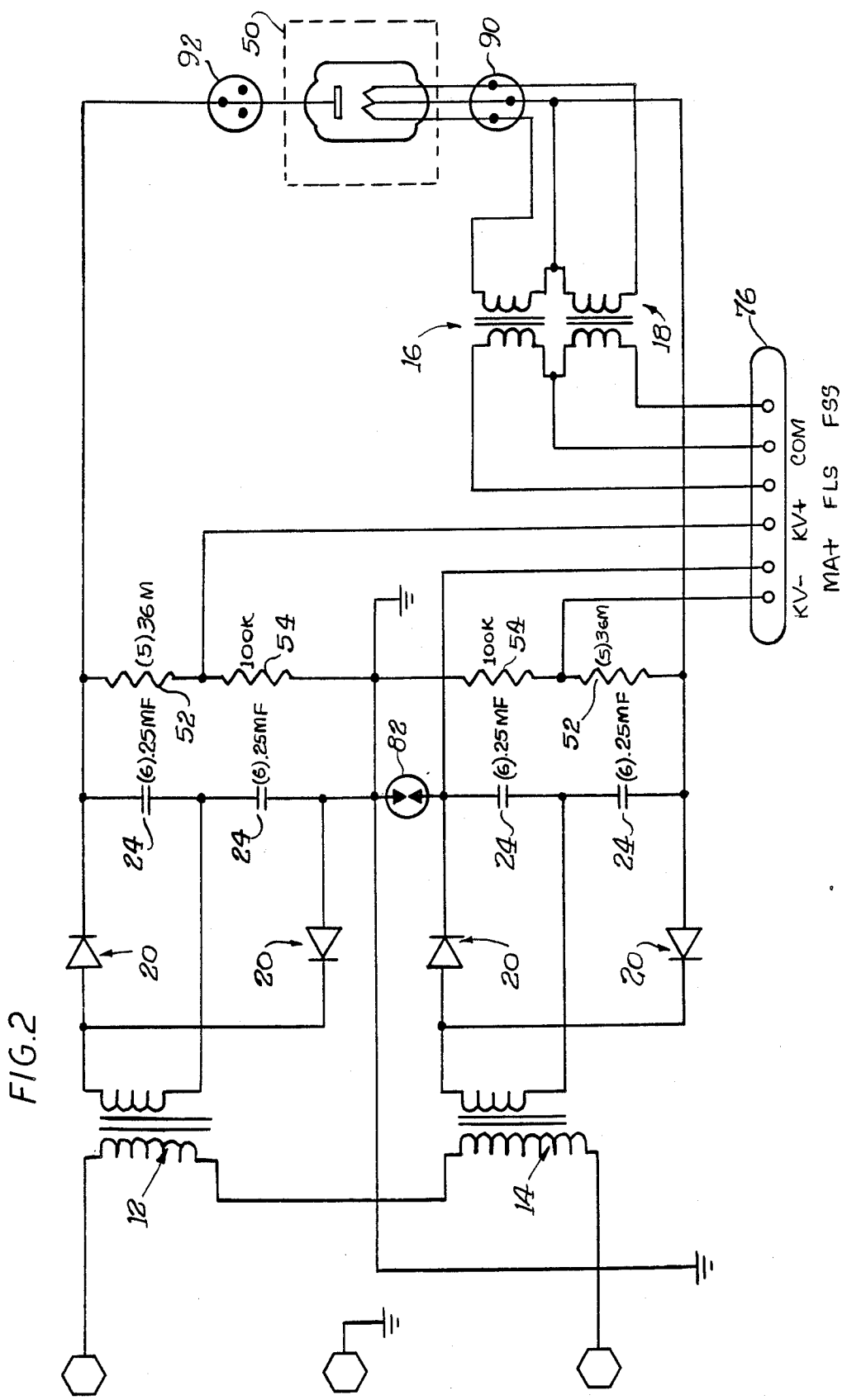
FIG. 2 is a schematic circuit diagram illustrating a high voltage transformer circuit defined by the assembly of FIG. 1.

Turning briefly to the schematic circuit diagram of FIG. 2, the respective transformers 12, 14 form respective transformers connected in the anode and cathode circuits of the X-ray tube 50, respectively, In accordance with a further feature of the invention, the diode printed circuit boards include means for coupling the respective diodes 20 together in electrical circuit so as to define respective high power handling diode circuit elements as illustrated in FIG. 2. That is, each of the diode circuit elements illustrated in FIG. 2 in fact comprises a plurality of individual diodes 20 coupled together in circuit.

Similarly, the capacitor circuit boards are configured for electrically interconnecting the respective capacitors 24 together in circuit to provide the four capacitance circuit elements illustrated in FIG. 2. As indicated in FIG. 2, each of the illustrated capacitance circuit elements in fact comprises six of the capacitors 24. In the preferred form, each of the four diodes illustrated in FIG. 2 comprises ten of the diode elements 20, although fewer such elements 20 are illustrated in FIG. 1, simply for ease of illustration and to avoid cluttering the drawing. In essence, each of the printed circuit boards 30, 32 comprises one of the four diode circuit elements illustrated in FIG. 2.

In the illustrated embodiment, each of the capacitor printed circuit boards also mounts, on the side thereof opposite capacitors 24, a plurality of resistor elements 52 and a resistor element 54, as generally indicated in FIG. 4. The resistor elements 52 are also coupled in electrical circuit by the printed circuit boards 34 and 36, respectively to form, respectively, two resistor elements 52 indicated in FIG. 2. In the illustrated embodiment five separate resistors 52 of a value of 36 megohms each are utilized in series to form a composite resistance element of 180 megohms. Resistor elements 54 are further coupled in series with the plural resistor elements 52 to bridge the anode and cathode circuits and provide tap off points for respective positive and negative kilovoltage (KV) outputs, respectively.

Referring again briefly to FIGS. 1 and 3, the filament transformers 16, 18, which are also illustrated in the schematic circuit diagram of FIG. 2, preferably comprise encapsulate-type transformers. The frame means include respective interior frame members 60, 62 and 64 which respectively mount oppositely facing intermediate or interior circuit board members 66 and 68. These frame members and intermediate printed circuit boards are located interiorly of the rectilinear enclosure, and are oriented, preferably, such that the printed circuit boards 66, 68 run transversely between respective capacitor printed circuit boards 34 and 36 and substantially bisect the enclosure. The high voltage transformer members 12 and 14 mount to associated respective frame members 72, 74, also forming part of the framing or frame means of the assembly, to either side of the intermediate printed circuit boards. The filament transformers 16 and 18 are mounted to and electrically connected with the X-ray tube filaments through circuit connections provided by, the intermediate circuit board 66. Intermediate circuit board 68 provides additional electrical connections to external terminals 76 which are mounted to a further, top printed circuit board 78 which mounts through a suitable opening provided therefor in the top plate member 40. Further circuit connections are completed by way of a bottom printed circuit board member 80 which is mounted to the bottom plate member 42.

Accordingly, the arrangement of printed circuit boards including the capacitor printed circuit boards 34, 36, the diode printed circuit boards 30, 32, the interior printed circuit boards 66, 68 and the top and bottom printed circuit boards 78, 80, cooperate to interconnect all of the circuit elements thus far described into the circuit configuration illustrated in FIG. 2. In this regard an additional spark gap member 82 is also provided, and is preferably wired to the printed circuit board 66 in generally the fashion illustrated in FIG. 7, which forms an enlargement of a relevant portion of FIG. 6 in this regard. The assembly thus far described is further held in assembled condition by additional brackets and fasteners as generally illustrated in FIGS. 3 and 4.

Additionally, it will be noted that the diode printed circuit boards are comparatively elongate, relatively narrow strips or "sticks". The means for both mounting these diode sticks or strips to the assembly, as well as for electrically interconnecting these printed circuit boards with the remaining circuit elements comprise respective top, intermediate and bottom interconnect printed circuit boards 84, 86 and 88. These latter boards are coupled to the respective diode printed circuit boards generally at right angles or transversely thereto and extend generally transversely across the free outer edges of respective capacitor printed circuit boards 34 and 36. Preferably, suitable brackets and fasteners are provided for mounting the respective circuit boards, as generally illustrated in FIGS. 3 and 4.

Additionally, respective anode and cathode connector members 90, 92 are, in the illustrated embodiment, mounted above the respective high voltage transformers 30, 32 and extend through the top plate member 40.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. A high voltage transformer assembly for use in a high frequency medical X-ray generator, comprising: a plurality of transformers; a plurality of filter capacitors; a pair of capacitor printed circuit boards for mounting said plurality of said capacitors and for coupling said plurality of capacitors in electrical circuit to define a plurality of relatively high power handling capacitance circuits; a plurality of diodes; diode printed circuit board means for mounting said plurality of diodes and for coupling said diodes in electrical circuit to define a plurality of relatively high power handling diode circuit elements; frame means; top and bottom plate-like members, and joining means for joining together said frame means, said top and bottom plate-like members and said pair of capacitor printed circuit boards forming an enclosure wherein said top and bottom plate-like members and said capacitor printed circuit boards comprise four sides of a generally rectilinear, six-sided enclosure; means for mounting respective ones of said diode printed circuit board means to the opposite, open ends of said enclosure so as to generally span the remaining two sides of said rectilinear enclosure; and means for electrically interconnecting said transformers, said diodes, and said capacitors in circuit to form a high voltage transformer circuit.

2. An assembly according to claim 1, and further including intermediate printed circuit board means mounted to said frame means and located interiorly of said rectilinear enclosure.

3. An assembly according to claim 2, wherein said transformer means includes filament transformers mounted to said intermediate printed circuit board means.

4. An assembly according to claim 2, wherein said transformer means further includes high voltage transformer means mounted to said frame means, and located to either side of said intermediate printed circuit board means.

5. An assembly according to claim 2, wherein said frame means includes interior frame members for mounting said intermediate printed circuit board means in an upright condition relative to said top and bottom plate-like members and running generally transversely between said capacitor printed circuit boards.

6. An assembly according to claim 1, wherein said diode printed circuit board means comprise a plurality of elongate, relatively narrow strips, and wherein said means for electrically interconnecting comprise a plurality of elongate, relatively narrow interconnect printed circuit boards mounted to said diode printed circuit boards and extending generally transversely thereof, and also mounted across said open ends of said rectilinear enclosure so as to mount the diode printed circuit boards thereto in a generally vertical orientation.

7. An assembly according to claim 1, wherein said means for electrically interconnecting include respective top and bottom printed circuit boards mounted adjacent said top and bottom plate-like members.

8. An assembly according to claim 2, wherein said means for electrically interconnecting include respective anode and cathode side printed circuit boards mounted adjacent said intermediate printed circuit board and facing oppositely outwardly for establishing electrical connections for said high voltage transformers, such that said high voltage transformers comprise respective anode and cathode transformers.

9. An assembly according to claim 1, and further including a plurality of resistor elements also mounted to said capacitor printed circuit boards and wherein said capacitor printed circuit boards include means for coupling said resistor elements in circuit with each other and with said capacitors, said diodes and said transformers to form high impedance, high power handling resistance elements for said high voltage transformer circuit.

10. An assembly according to claim 3 wherein said filament transformers comprise encapsulate-type transformers.

* * * * *